(12) United States Patent
Dachtera et al.

(10) Patent No.: US 6,815,282 B2
(45) Date of Patent: Nov. 9, 2004

(54) SILICON ON INSULATOR FIELD EFFECT TRANSISTOR HAVING SHARED BODY CONTACT

(75) Inventors: William R. Dachtera, Poughkeepsie, NY (US); Rajiv V. Joshi, Yorktown Heights, NY (US); Werner A. Rausch, Stormville, NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 10/460,717

(22) Filed: Jun. 12, 2003

(65) Prior Publication Data

US 2003/0218198 A1 Nov. 27, 2003

Related U.S. Application Data

(62) Division of application No. 09/547,893, filed on Apr. 12, 2000, now Pat. No. 6,624,459.

(51) Int. Cl.[7] .............................................. H01L 29/72
(52) U.S. Cl. ...................... 438/204; 438/205; 438/207; 438/310; 438/312; 438/422; 257/368
(58) Field of Search .......................... 257/368; 438/204, 438/205, 207, 310, 312, 422

(56) References Cited

U.S. PATENT DOCUMENTS 5,767,549 A * 6/1998 Chen et al. ................ 257/347
5,774,411 A 6/1998 Hsieh et al.
6,194,763 B1 2/2001 Hisamoto et al.
6,344,671 B1 2/2002 Mandelman et al.

OTHER PUBLICATIONS

Kuang et al., "SRAM Bitline Circuits on PD SOI: Advantages and Concerns," *IEEE J. of Solid State Circuits*, 6, (Jun. 1997).

Chuang, C. T., "Design Considerations of SOI Digital CMOS VLSI" *Proc. 1998 IEEE International SOI Conference* (Oct. 1998).

* cited by examiner

*Primary Examiner*—Edward Wojciechowicz
(74) *Attorney, Agent, or Firm*—Law Office of Charles W. Peterson, Jr.; Louis J. Percello

(57) ABSTRACT

Silicon on insulator (SOI) field effect transistors (FET) with a shared body contact, a SRAM cell and array including the SOI FETs and the method of forming the SOI FETs. The SRAM cell has a hybrid SOI/bulk structure wherein the source/drain diffusions do not penetrate to the underlying insulator layer, resulting in a FET in the surface of an SOI layer with a body or substrate contact formed at a shared contact. FETs are formed on SOI silicon islands located on a BOX layer and isolated by shallow trench isolation (STI). NFET islands in the SRAM cells include a body contact to a P-type diffusion in the NFET island. Each NFET in the SRAM cells include at least one shallow source/drain diffusion that is shallower than the island thickness. A path remains under the shallow diffusions between NFET channels and the body contact. The P-type body contact diffusion is a deep diffusion, the full thickness of the island. Bit line diffusions shared by SRAM cells on adjacent wordlines may be deep diffusions.

12 Claims, 5 Drawing Sheets

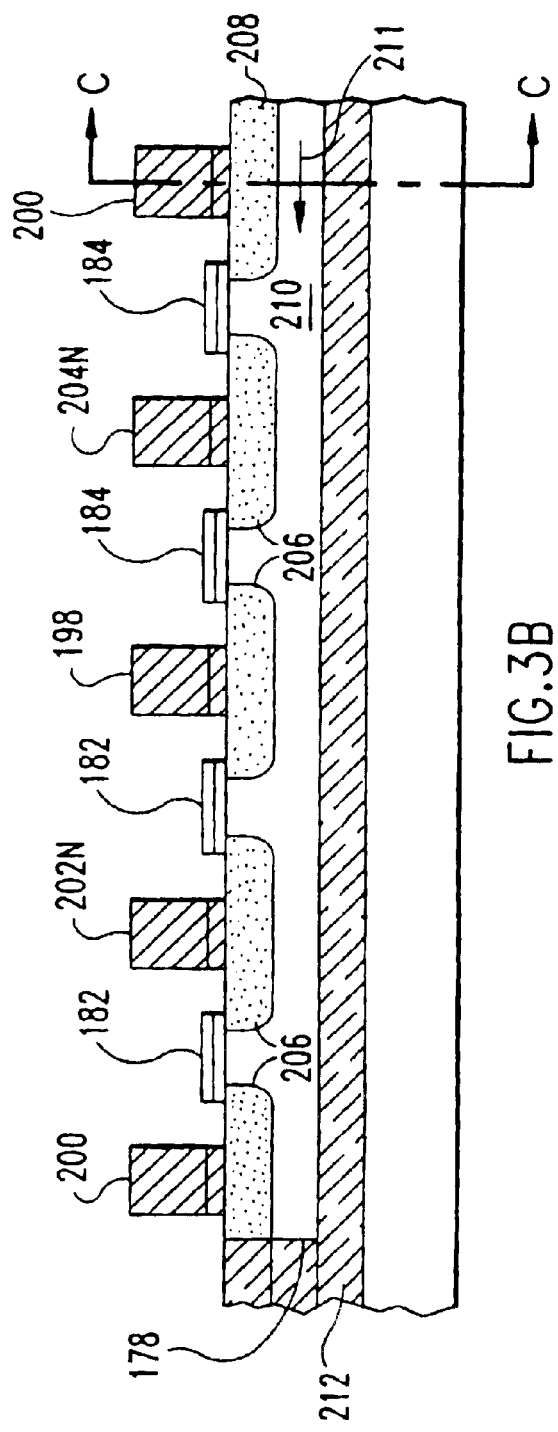
FIG.3B
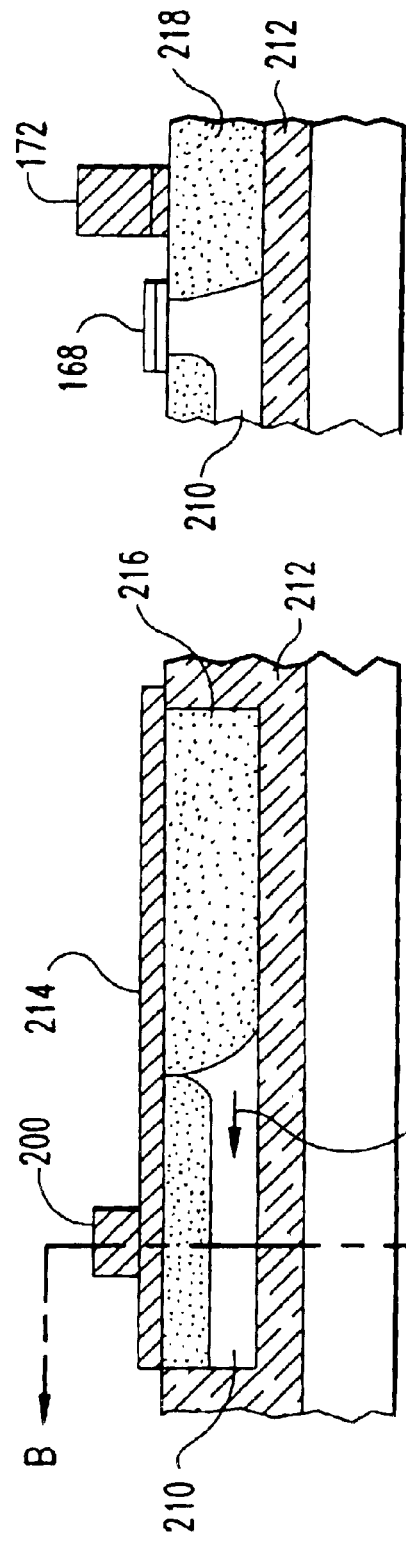
FIG.3D
FIG.3C

SILICON ON INSULATOR FIELD EFFECT TRANSISTOR HAVING SHARED BODY CONTACT

RELATED APPLICATION

The present application is a divisional application of U.S. patent application Ser. No. 09/547,893 filed Apr. 12, 2000 entitled "SILICON ON INSULATOR FIELD EFFECT TRANSISTOR HAVING SHARED BODY CONTACT" to Dachtera et al. now issued as U.S. Pat. No. 6,624,459 B1.

BACKGROUND OF THE INVENTION

1. Field of the Invention

The present invention relates to semiconductor integrated circuit and, more particularly to very large scale integrated (VLSI) circuits wherein field effect transistors (FETs) are formed in a surface layer of a silicon on insulator (SOI) chip.

2. Background Description

Bulk silicon field effect transistors (FETs) are formed on the surface of a silicon chip or wafer. In what is typically referred to as CMOS technology, the silicon wafer or substrate may be of one conduction type, e.g., P-type, and areas or wells of a second conduction type, e.g., N-type, are formed in the P-type wafer. N-type FETs (NFETs) are formed on the surface of the P-type wafer and P-type FETs (PFETs) are formed on the surface of the N-wells. A first bias voltage, typically zero Volts (0V) or ground (GND), is applied to the substrate to bias the NFETs and a second bias voltage, typically the supply voltage ($V_{hi}$), is applied to the N-wells. The substrate and N-well bias voltages help to stabilize respective FET electrical characteristics, including improving threshold voltage ($V_t$) and device current stability. Changing a device bias changes device characteristics, increasing/decreasing device $V_t$ and decreasing/increasing device operating current depending upon the magnitude and direction of the respective change.

Performance improvements for these prior art bulk transistor technologies has been achieved, normally, by reducing feature size or "scaling." In addition to scaling, more recently, silicon on insulator (SOI) technology has become the main source of performance improvement for transistors.

FIG. 1 shows a cross section 100 of a prior art SOI wafer through a pair of transistors 102, 104 that may be NFETs or PFETs. The FETs 102, 104 are formed in a thin silicon surface layer 106 that is isolated from an underlying silicon substrate 108 by a buried oxide (BOX) layer 110. In a typically complex series of mask steps, SOI islands 112 are formed in the silicon surface layer 106 by etching shallow trenches through the surface layer 106 and filling the shallow trenches with oxide 114 to isolate islands 112 from each other. This type of isolation is normally referred to as Shallow trench isolation (STI). STI is used to isolate circuits formed on the islands from each other and, also, isolate the FETs forming the circuits from each other.

After forming a gate oxide layer on the surface of the silicon islands 112, gates 116 are patterned and formed at the location of devices 102, 104. Source/drain regions 118 are defined using a standard implant and diffusion step, after forming lightly doped diffusion regions 120 at the gate boundaries, if desired. Metal contacts 122 are selectively formed at source/drain regions 118. Device channels 124, 126 are completely isolated from other channels by source/drain diffusions 118 at either end, BOX layer 110 below, gate oxide above and STI (not shown) along the sides of the channel.

Ideally, the thin silicon surface layer 106 is no thicker than what is necessary to form a channel 124, 126 between a pair of source/drain diffusions 118. However, in practice, the silicon surface layer is thicker than the depth of the FET's channel inversion layer. So, when the channel inversion layer forms, i.e., when the FET is turned on, an uninverted layer remains beneath the channel inversion layer. This uninverted layer remains isolated, resistively, from adjacent regions and any charge that is introduced into the uninverted channel region remains trapped there until it leaks out through junction leakage or is otherwise coupled out. This trapped charge can produce unwanted device channel bias resulting in what is referred to as body effects that are localized to an individual device.

So, these prior art SOI FETs 102, 104 have isolated floating channels 124, 126 that are not biased by any bias voltage. Thus, the channel bias of any device is dependent upon its current operating state and the device's history, i.e., any remaining charge that has been previously introduced through capacitive coupling or bipolar injection. For typical individual logic circuits such as, decoders, clock buffers, input or output drivers and array output drivers, slight variations in device characteristics that result from floating device channels, may be negligible, neglectable and given little consideration.

However, these localized body effects and other sporadically occurring parasitic bipolar effects, i.e., at source/drain diffusion junctions, are serious design problems for densely packed SOI circuits such as for example, memory arrays. Body effects occur as a particular device switches because charge is capacitively coupled into/out of the floating channel area. Bipolar effect current may add charge to the floating channel. Further, charge in any particular device may vary as the chip operates because individual devices switch somewhat independently of each other. As noted above, FET device characteristics are dependent upon device substrate voltage. Repetitively accessing a random access memory (RAM) cell, both to read and to write it, unintentionally induces local body effects in some cell devices.

For prior art SOI SRAMs, these body effects change device thresholds and modulate device currents for affected devices reducing the signal stored in the cell as well as the signal passed by cell access transistors. These local effects can cause the SRAM cell to favor one state over the other, resulting in sporadic read upsets with no apparent reason. An imbalance in cell pass gates may increase cell write time and sense time. As a result, intermittent problems may arise, such as spuriously reading the wrong data or, random cell failures. These types of intermittent problems are notoriously difficult to identify and diagnose. So, channel bias variations from body effects causes device non-uniformities that result in difficult to identify sporadic chip failures sometimes characterized as "soft failures."

Thus, there is a need for improving SOI RAM stability.

PURPOSES OF THE INVENTION

It is a purpose of this invention is to improve memory cell stability;

It is another purpose of the invention to improve static random access memory (SRAM) cell tolerance to local body effects;

It is yet another purpose of the invention to improve SRAM cell tolerance to local body effects while maintaining cell density.

SUMMARY OF THE INVENTION

The present invention is a silicon on insulator (SOI) field effect transistors (FET) with a shared body contact, a SRAM cell and array including the SOI FETs and the method of forming the SOI FETs. The SRAM cell has a hybrid SOI/bulk structure wherein the source/drain diffusions do not penetrate to the underlying insulator layer, resulting in a FET in the surface of an SOI layer with a body or substrate contact formed at a shared contact. FETs are formed on SOI silicon islands located on a BOX layer and isolated by shallow trench isolation (STI). NFET islands in the SRAM cells include a body contact to a P-type diffusion in the NFET island. Each NFET in the SRAM cells include at least one shallow source/drain diffusion that is shallower than the island thickness. A path remains under the shallow diffusions between NFET channels and the body contact. The P-type body contact diffusion is a deep diffusion, the full thickness of the island. Bit line diffusions shared by SRAM cells on adjacent wordlines may be deep diffusions.

BRIEF DESCRIPTION OF THE FIGURES

The foregoing and other objects, aspects, and advantages will be better understood from the following non limiting detailed description of preferred embodiments of the invention with reference to the drawings that include the following:

FIGS. 3A–D show an example of a SRAM cell including preferred embodiment NFETs;

DESCRIPTION OF A PREFERRED EMBODIMENT OF THE INVENTION

Figure 2:
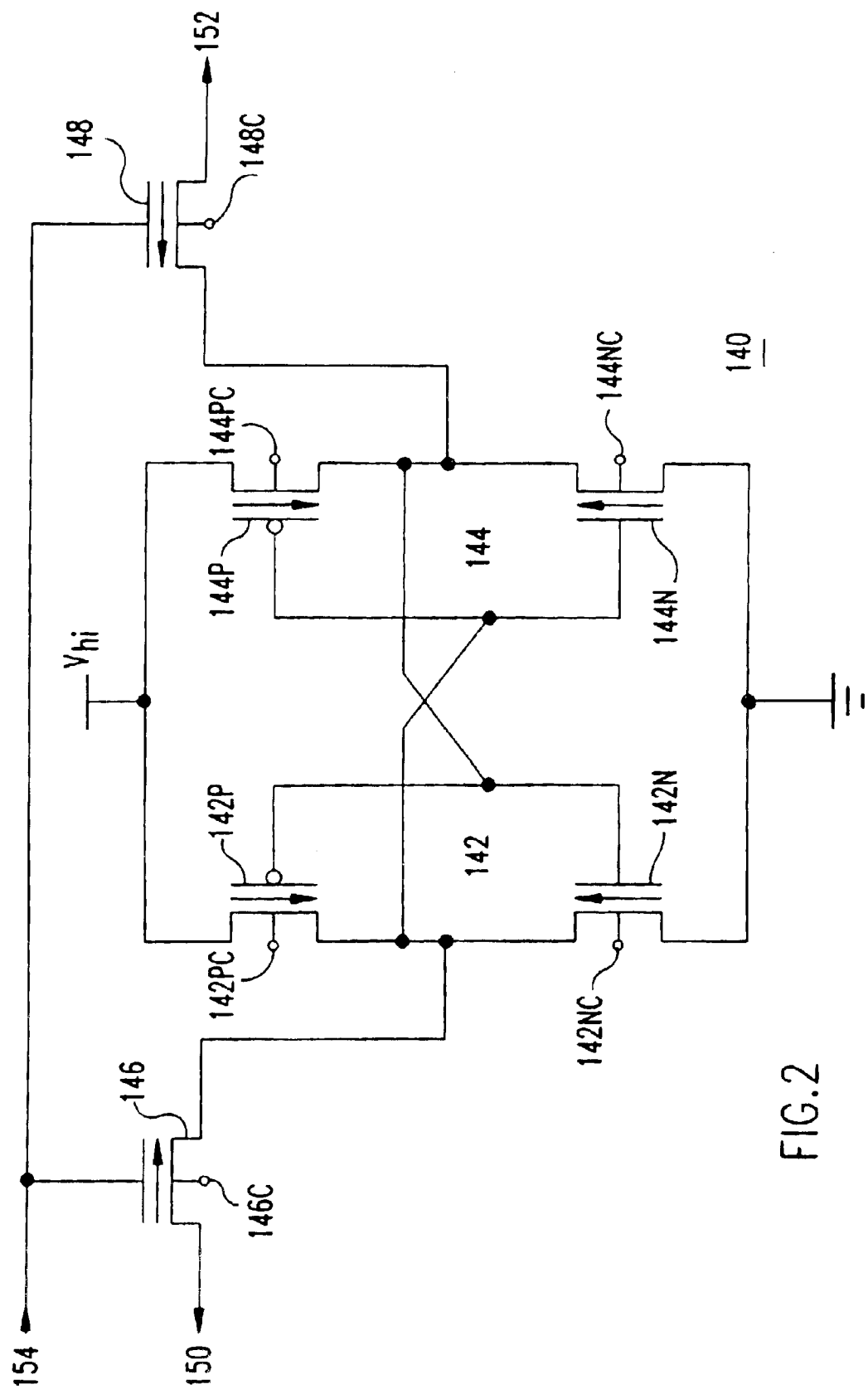
FIG. 2 is a schematic of a typical CMOS Static RAM (SRAM) cell.

Turning now to the drawings and, more particularly, FIG. 2 is a schematic of a typical CMOS Static RAM (SRAM) cell 140. The cell 140 is, essentially, an identical pair of cross coupled CMOS inverters 142, 144 and a pair of pass transistors 146, 148 between the cross coupled inverters 142, 144 and a pair of bit lines 150, 152. A word line 154 is tied to the gate of pass transistors 146, 148. Each CMOS inverter 142, 144 is, simply, an NFET 142N, 144N and a PFET 142P, 144P. The gate and drain of each PFET 142P, 144P is tied to the gate and drain of corresponding NFET 142N, 144N, respectively. The source of the PFETs 142P, 144P are connected to supply voltage ($V_{hi}$) and the source of the NFETs 142N, 144N are connected to GND. The channel body for each FET 142N, 142P, 144N, 144P, 146 and 148 is represented by node 142NC, 142PC, 144NC, 144PC, 146C and 148C, respectively. The state of the cross coupled inverter pair 142, 144 determines the state of data stored in the cell 140.

Each SRAM cell 140 is written by pulling one of the bit line pair 150, 152 high and the other low while holding word line 154 high so that both access transistors 146, 148 are on; and, then pulling the word line 154 low to turn off the access transistors 146, 148, trapping the state of the bit lines in the cross coupled inverters 142, 144. The SRAM cell 100 is read by precharging the bit lines 150, 152 to a known state; driving the word line 154 high which couples the cross coupled inverters 142, 144 through the access transistors 146, 148 to the bit line pair 150, 152; and, then, measuring the resulting voltage difference on the bit line pair 150, 152. The signal on the bit line pair 150, 152 increases with time toward a final state wherein each one of the pair 150, 152 may be, ultimately, a full up level and a full down level. However, to improve performance, the voltage difference is sensed well before the difference reaches its ultimate value.

Figure 1:
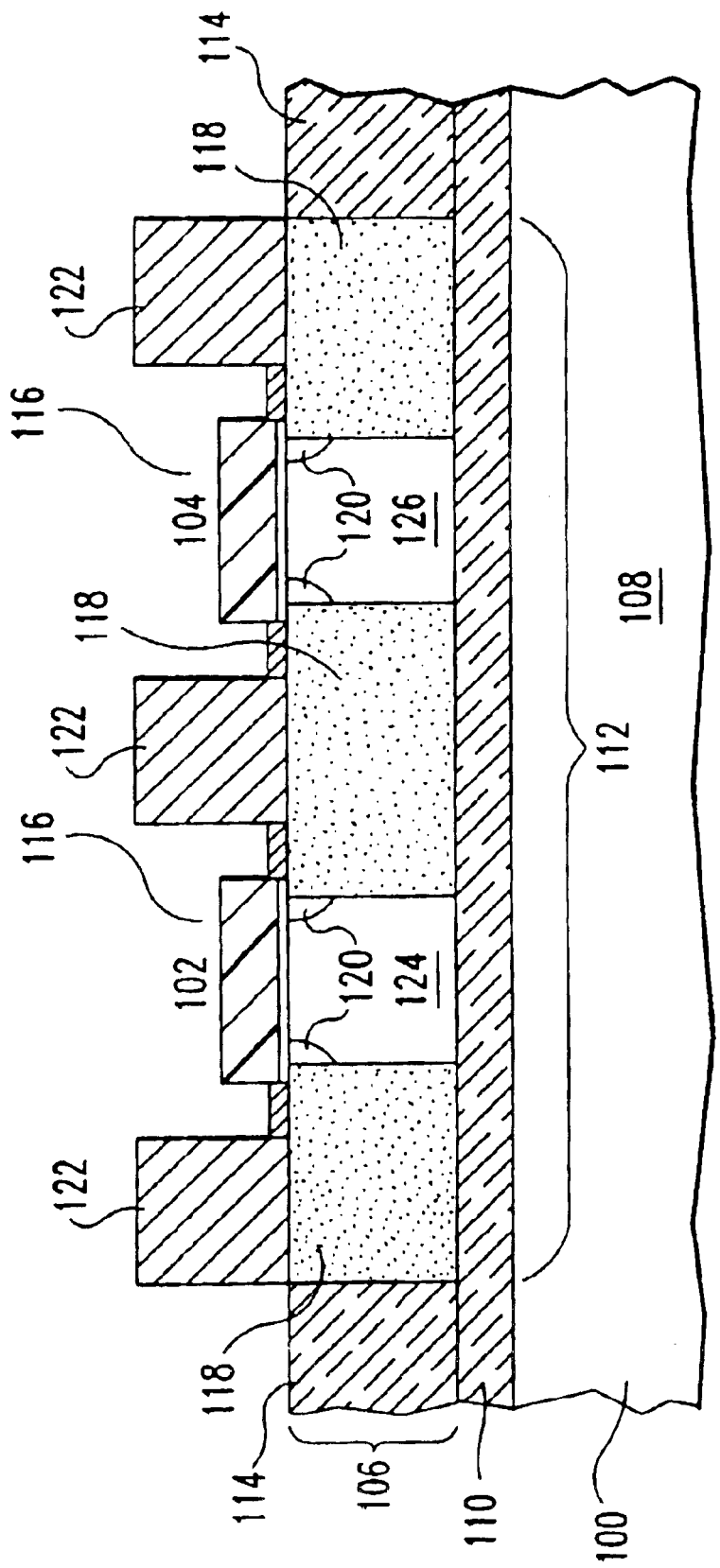
FIG. 1 shows a cross section of a SOI wafer through a pair of transistors which may be NFETs or PFETs.

As noted hereinabove, in a prior art bulk CMOS technology 142NC, 144NC, 146C and 148C were tied to GND and, 142PC and 144PC were tied to $V_{hi}$ biasing the respective devices. However, in the prior art SOI process of FIG. 1, all of the FETs 142N, 142P, 144N, 144P, 146 and 148 in a SRAM cell 140 have floating channels, i.e., 142NC, 142PC, 144NC, 144PC, 146C and 148C are not connected directly to any bias voltage and, at best, capacitively coupled to underlying silicon substrate 108.

The present invention is an SOI transistor having one or more shallow source/drain diffusions and a body contact for the transistor, SOI circuits including the transistor, SOI RAM cells formed from one or more of the transistors and the process of forming the SOI transistors. The body contact to the silicon surface island on which the transistors are formed biases the transistors through a continuous connection reaching one or more channels under the shallow diffusions. The shallow source/drain diffusions are formed in the surface of the SOI surface layer, but not completely through to the underlying buried insulator layer. So, each such transistor has a current path remaining under the shallow diffusion to connect it to the shared body voltage contact. Thus, the preferred SOI structure is a hybrid structure including a continuous body shared by multiple FETs contained within an SOI surface layer. The bias voltage applied to the shared body provides a bias voltage for all FETs sharing that body, in the embodiment described herein tying 142NC, 144NC, 146C and 148C to the same bias voltage.

By contrast, prior art approaches to reducing body effects in SOI devices, include forming body contacts, typically, to a conduction region or diffusion that extends under one or more device gates. The conduction region has conduction type opposite that of the respective device's source/drain regions 118. However, adding such body contacts increases cell size appreciably, trading size (density) for performance. Other approaches include forming Schottky barrier diodes, e.g., alongside, contacting the channels. Including Schottky barrier diodes incurs a minor area penalty, but with the disadvantage of making the already complicated SOI process even more complex. See, for example, "DC and Transient Characterization of a Compact Schottky Body Contact Technology for SOI Transistors" by Jeffrey W. Sleight, *IEEE Transactions on Electron Devices*, Vol. 46, No. 7, July 1999, pp. 1451–6.

For a state of the art approach to providing body contacts to a pair of adjacent FETs, especially for FETs in a sense amplifier, see "A Pair of FETs Including A Shared SOI Body Contact And The Method of Forming The FETs" to Mandelman et al., U.S. Pat. No. 6,344,671 B1 issued Feb. 5, 2002 assigned to the assignee of the present invention. Mandelman et al. teaches a body contact for pairs of devices, especially for dynamic RAM (DRAM) sense amplifiers. In the structure taught by Mandelman et al., a portion of the device width is dedicated for body contacts for a pair of devices. Source/drain diffusions are blocked from forming in the body contact portion, trading additional device width (density) for stability and performance. While this solution may be acceptable for devices that are a fraction of the total chip/macro area, such as sense amplifiers, using the approach of Mandelman et al. in SRAM cell devices could easily double the cell size and, correspondingly, macro or chip size.

Figure 3A:
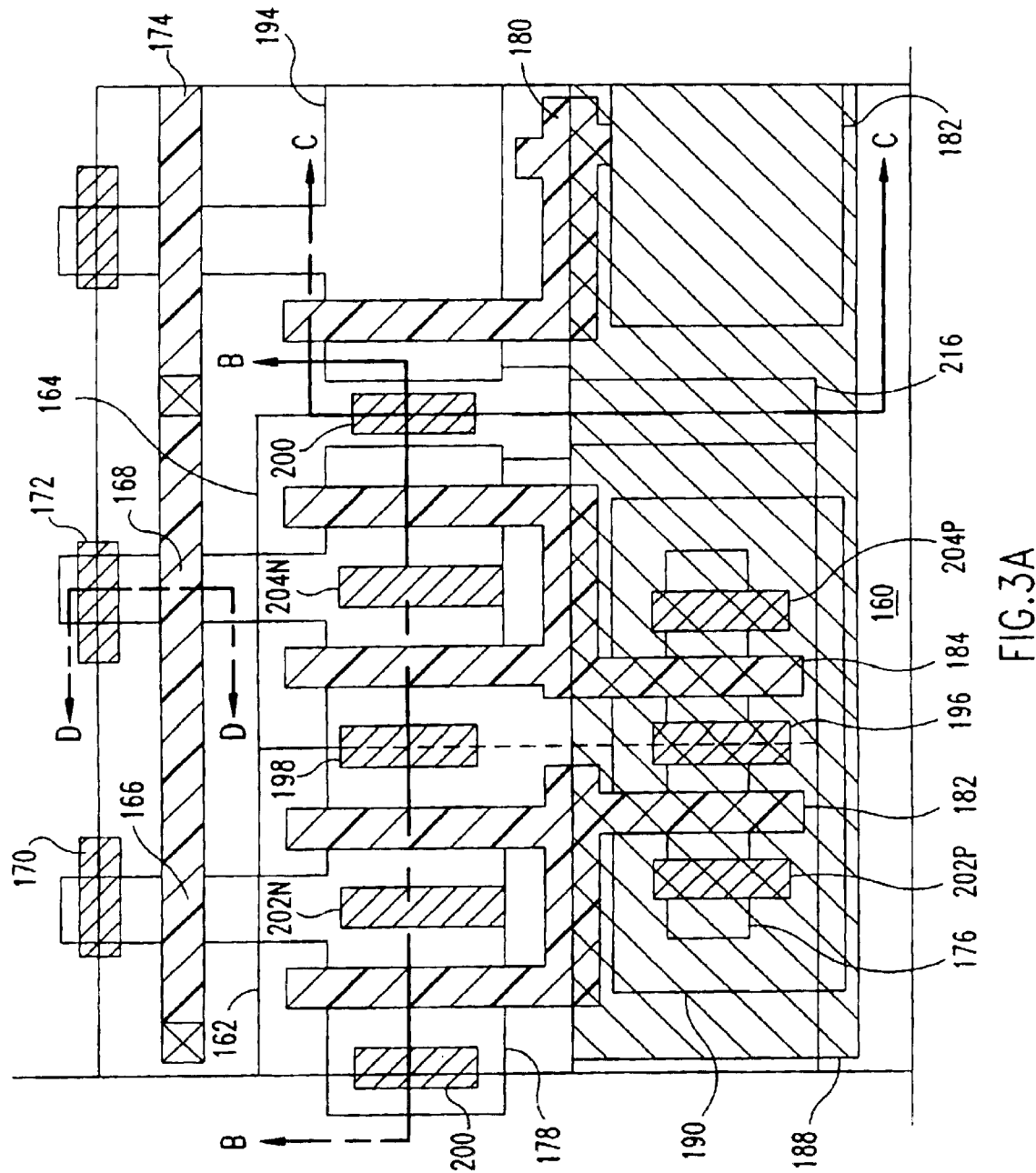

FIGS. 3A–D show an example of a SRAM 160 cell including preferred embodiment NFETs. FIG. 3A shows a plan view (not to scale) of the preferred SRAM cell 160 and FIGS. 3B–D are cross-sections of the SRAM cell 140. In this embodiment, the SRAM cell 160 is schematically identical to the SRAM cell 140 of FIG. 2 with channel nodes 102NC, 104NC, 106C and 108C connected to GND and channel nodes 102PC and 104PC floating. Thus, the SRAM cell 160 includes a pair of cross coupled CMOS inverters 162 and 164 (corresponding to inverters 142, 144) and a pair of pass transistors 166, 168 (corresponding to pass transistors 146, 148) between the cross coupled inverters 162 and 164 and bit lines 170, 172, which correspond to bit lines 150, 152. The pass transistors 166, 168 are driven by polysilicon word line 174, which corresponds to word line 154.

In the plan view of this embodiment, for simplicity, intra-cell wiring and global wiring (e.g., global bit lines, GND and $V_{hi}$) is not shown. Also, individual devices are identified by the intersection of silicon islands 176, 178 with patterned polysilicon 180, 182 and 184. Intersection of P-diffusion region mask 188 and N body implant region masks 190, 192 (i.e., for PFET channel tailoring) define PFET device areas. The portion of silicon island 178 identified by polygon 194, N implant block mask 192, and patterned poilysilicon shape 180 are portions of an identical adjacent cell 160, such as in an SRAM array. Each cell includes a single $V_{hi}$ contact 196, an unshared GND contact 198 and, shares GND contacts 200 with adjacent cells. Contacts 202N and 204N are connected by intra-cell wiring (not shown) to corresponding contacts 202P and 204P forming the outputs of inverters 162 and 164, respectively, and to patterned polysilicon 182 and 184, cross-coupling the inverters 162, 164.

As can be better understood in view of FIG. 3B, which is a cross section of cell 160 through silicon island 178 at B—B, devices in inverters 162 and 164 (N devices in FIG. 3B) are formed by the intersection of patterned gate polysilicon 182 and 184 with silicon islands 178 and 176. Preferably, the patterned polysilicon 182, 184 is formed from a layered conductive material including a thin metal or silicide layer, which may be omitted if so desired. For cell stability, density and convenience, NFETs 142N and 144N are formed as a pair of identical parallel devices, each sharing a GND/output contact 198, 200/202N, 204N. PFETs 142P, 144P share $V_{hi}$ contact 196 and are situated between $V_{hi}$ contact 196 and a respective output contact 202P, 204P. It is understood that FETs 142N, 142P, 144N and 144P each may be a fingered device including any number of fingers without departing from the spirit or scope of the invention. Pass transistors 166, 168 are formed at the intersection of word line 174 with silicon island 178 between output contacts 202N, 204N and bit line contacts 170, 172, respectively.

Also, each preferred embodiment FET includes at least one source/drain diffusion 206, 208 that does not extend the entire depth of the P-type surface silicon layer 210. Thus, the P-type bodies of NFET channels are not individually isolated by source/drain diffusion, but are electrically connected to one another in silicon layer 210. A path represented by arrow 211 is formed under the shallow source/drain diffusions 206, 208 and above the BOX layer 212 to the device channels.

Turning to FIG. 3C, which is a cross section of FIG. 3A through C—C, a body contact to a bias voltage is shown, the bias voltage biasing the channels along the path 211. The body contact is formed by extending a thin metal layer 214 (e.g., a silicide layer) from a shared GND contact 200 at shallow diffusion 208 to a P-diffusion 216. The thin metal layer 214 is an ohmic contact to shallow N diffusion 208 and P diffusion 216, shorting the resulting PN junction. Accordingly, P-diffusion 216 connects the GND contact 200 to the P-type body path 211 of the cell's NFETs, providing a current path therebetween. So, all four NFET body contact terminals 142NC, 144NC, 146C and 148C are connected to GND through P-diffusion 216, substantially reducing local body effect in preferred embodiment cells over prior art SDRAM cells.

As can be seen from FIG. 3D, which is a cross-section through D—D, body effects are also minimized for pass transistors 166, 168, the channels of which are also biased by the contact to GND at P-diffusion 216. In this example, bit line diffusion 218, unlike shallow diffusions 206, 208, extends the full thickness of surface silicon layer 210. Thus, in this embodiment the bit line diffusions 218 serve to reduce cell capacitance and to isolate cells 160 from cells on an adjacent word line sharing the bit line diffusions/contacts (not shown), as is typically practiced. The isolation from source/drain diffusions 218 minimizes possible disturbances from accessed cells to unaccessed cells on adjacent word lines that might otherwise arise. Optionally, however, all diffusions may have a uniform depth, i.e., that of diffusions 206 and 208.

The shallow diffusion structure of FIGS. 3A–D is formed by following normal SOI steps for all but the source/drain diffusion step. Thus, after forming a layered wafer and defining gates on the wafer, shallow source/drain regions are defined and source/drain regions are formed, including both shallow and deep source/drain regions, if desired. In a first preferred embodiment, shallow diffusions may be formed by first implanting to form a typical lightly doped diffusions, such as what may be normally referred to as a lightly doped drain (LDD); source/drain diffusions that are to remain shallow junctions are masked; and, normal, deep source/drain regions (e.g., bit line diffusions or body contacts) are formed in unmasked areas. In a second embodiment, shallow diffusion regions are enhanced with a second implant to form a diffusion that is slightly deeper than a normal LDD diffusion layer implant; and then, following the steps of the first embodiment, shallow diffusion regions are masked and normal, deep source/drain regions are formed in unmasked areas. In particular, this second embodiment may be preferred if it is determined that shallow junctions formed using the single LDD layer formation of the first embodiment method are too shallow to silicide.

However, any appropriate process steps that result in a structure as in FIGS. 3A–D may be substituted. Further, although the example of FIGS. 3A–D show body contacts being provided only for NFETs, it is understood that body contacts may also be provided for PFETs by including appropriate steps to form such contacts between $V_{hi}$ and a deep N-diffusion in contact with the N-type bodies of PFET channels.

Figure 4:
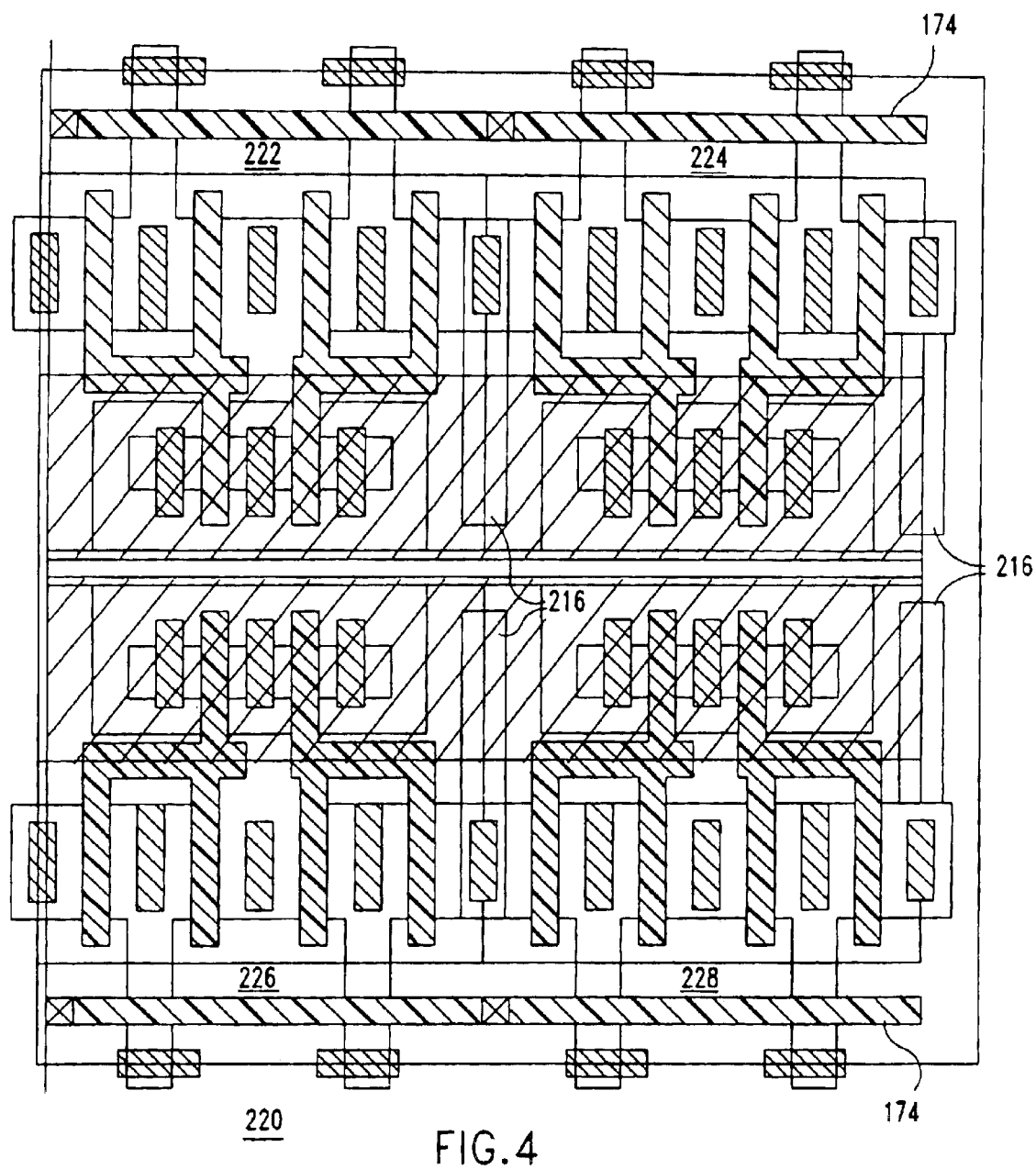
FIG. 4 shows a cross section of an SRAM array of preferred embodiment cells, such as the cell in the example of FIGS. 3A–D.

FIG. 4 shows a section 220 of an SRAM array, such as in an SRAM macro or chip. The array section 220 in this example includes four preferred embodiment cells 222, 224, 226 and 228, such as the cell 160 in the example of FIGS. 3A–D each cell sharing a body contact 216 with an adjacent cell 160 that share the same word line 174. Optionally, additional body contacts 216 may be included, periodically, along the word lines between groups of n cells 160, such as at the edges of a sub array or, wherever what are known as stitch cells may be placed.

As also can be seen from FIG. 4, the shared body contact 216 may marginally increase cell area. Optionally, to further improve array density, fewer body contacts 216 may be included, e.g., between every other pair or every n pairs of adjacent cells 160. Also, GND contacts 200 shared by adjacent cells 160 may alternate between shallow diffusions 208 connected to body contacts 216 and deep diffusions, e.g., 218, when body contacts are provided between every other pair of adjacent cells 160.

It is understood that the preferred embodiment transistors are not limited to SRAM arrays, but may be used wherever high performance well matched FETs are required. For example, state of the art sense amplifiers, typically require a balanced pair of cross coupled transistors and must sense a signal (potential difference) that is something less than the ultimate signal. Since the signal is time dependent, the smaller the potential difference that the sense amplifier can sense the better. So, any difference in the sense amplifier transistors increases the signal magnitude necessary for sensing and, therefore, slows sensing. Consequently, RAM designers are well aware that it is important that the sense amplifier transistors have identical device characteristics and are what is known as a balanced or matched pair. Thus, great care is taken in designing a balanced pair to insure that each transistor is influenced by ambient conditions identically with the other of the pair. Localized body effects, which for sense amplifiers made using prior art SOI transistors can easily be cause an imbalance, can be nearly eliminated using a preferred embodiment SOI CMOS pair.

Thus, SOI RAM cells formed according to the preferred embodiment of the present invention are significantly more immune to local body effects. Also, by including preferred embodiment FETs in peripheral circuits, such as sense amplifiers, additional improvement will result. Logic formed using preferred embodiment FETs may also benefit from improved body effect immunity.

While the invention has been described in terms of preferred embodiments, those skilled in the art will recognize that the invention can be practiced with modification within the spirit and scope of the appended claims.

We claim:

1. A method of forming a SOI SRAM including a plurality of SRAM cells each of said SRAM cells including a plurality of field effect transistors, said method comprising the steps of:
   a) forming a buried oxide (BOX) layer in a silicon wafer, said BOX layer isolating a silicon surface layer from a silicon substrate;
   b) forming silicon islands from said silicon surface layer;
   c) forming field effect transistor (FET) gates on said silicon islands;
   d) forming shallow diffusions of a first dopant type adjacent a plurality of said FET gates, said shallow diffusions extending from an upper surface of said silicon surface layer to a point above said BOX layer; and
   e) forming a body contact diffusion in a plurality of said islands, each said body contact diffusion extending from said upper surface below said point.

2. A method of forming a SOI SRAM as in claim 1, wherein said step (c) of forming FET gates forms pass gate transistor pairs in said SRAM cells and said step (e) of forming said body contact forms one P-type body contact at each pass gate transistor pair.

3. A method of forming a SOI SRAM as in claim 2, wherein said step (d) of forming the shallow diffusions forms a deep diffusion at one side of each of said pair of pass gates bit line contact being formed at said deep, diffusions, said step (d) comprises the steps of:

i) implanting a shallow diffusion implant into a plurality of said silicon islands;
ii) forming a blockout mask over portions of said plurality of silicon islands;
iii) implanting a deep diffusion implant into areas of said plurality of islands not being covered by said blockout mask; and,
iv) diffusing implanted dopant, shallow diffusion implant and deep diffusion implant merging to form deep diffusions.

4. A method of forming a SOI SRAM as in claim 2, wherein said step (c) of forming FET gates forms a pair of cross coupled inverters in each of said SRAM cells, said P-type body contact formed at each corresponding said pass gate transistor pair forming a body contact for NFETs in said each SRAM cell.

5. A method of forming a SOI SRAM as in claim 1, wherein said step (c) of forming FET gates forms pairs of cross coupled NFETs in said SRAM sense amplifiers and said step (e) of forming said body contact forms one P-type body contact at each cross coupled pair.

6. A method of forming a SOI SRAM as in claim 3, wherein said step (iv) of diffusing forms said deep diffusions through the thickness of said silicon islands.

7. A method of forming a SOI SRAM as in claim 1, further comprising the step of:
   f) forming a conductive strap on said upper surface between each said body contact diffusion and one of said shallow diffusions.

8. A method of forming a SOI SRAM as in claim 1, wherein said first dopant type is an N-type dopant.

9. A method of forming a SOI SRAM including a plurality of SRAM cells each of said SRAM cells including a plurality of field effect transistors, said method comprising the steps of:
   a) forming a buried oxide (BOX) layer in a silicon wafer, said BOX layer isolating a silicon surface layer from a silicon substrate;
   b) forming silicon islands from said silicon surface layer;
   c) forming field effect transistor (FET) gates on said silicon islands, ones of said FET gates forming pass gate transistor pairs in said SRAM cells;
   d) forming shallow N-type diffusions adjacent a plurality of said FET gates, said shallow diffusions extending from an upper surface of said silicon surface layer to a point above said BOX layer; and
   e) forming a P-type body contact diffusion in a plurality of said islands, one said P-type body contact being formed at each said pass gate transistor pair.

10. A method of forming a SOI SRAM as in claim 9, wherein said step (c) of forming FET gates forms pairs of cross coupled NFETs in said SRAM sense amplifiers and said step (e) of forming said P-type body contact forms one said P-type body contact at each cross coupled pair.

11. A method of forming a SOI SRAM as in claim 9, wherein step (d) of forming the shallow N-type diffusions forms a deep N-type diffusion at one side of each of said pair of pass gates, a bit line contact being formed at said deep n-type diffusions, said step (d) comprises the steps of:
   i) implanting a shallow N-type implant into a plurality of said silicon islands;
   ii) forming a blockout mask over portions of said plurality of silicon islands;
   iii) implanting a deep N-type implant into areas of said plurality of islands not being covered by said blockout mask; and, iv) diffusing implanted N-type dopant, such that diffusions from said shallow implanted N-type dopant and said deep implanted N-type dopant merge, forming deep diffusions.

12. A method of forming a SOI SRAM including a plurality of SRAM cells each of said SRAM cells including a plurality of field effect transistors, said method comprising the steps of:

a) forming a buried oxide (BOX) layer in a silicon wafer, said BOX layer isolating a silicon surface layer from a silicon substrate;

b) forming silicon islands from said silicon surface layer;

c) forming field effect transistor (FET) gates on said silicon islands, ones of said FET gates forming pairs of cross coupled inverters in each of said SRAM cells;

d) forming shallow N-type diffusions adjacent a plurality of said FET gates, said shallow diffusions extending from an upper surface of said silicon surface layer to a point above said BOX layer; and e) forming a P-type body contact diffusion in a plurality of said islands, one said P-type body contact being formed at each said pass gate transistor pair.

* * * * *